(12) United States Patent
Nakahata et al.

(10) Patent No.: US 7,485,484 B2
(45) Date of Patent: Feb. 3, 2009

(54) GROUP III-V CRYSTAL

(75) Inventors: Seiji Nakahata, Itami (JP); Koji Uematsu, Itami (JP); Ryu Hirota, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/871,162

(22) Filed: Oct. 12, 2007

(65) Prior Publication Data

US 2008/0038580 A1 Feb. 14, 2008

Related U.S. Application Data

(62) Division of application No. 10/521,060, filed on Dec. 30, 2004, now Pat. No. 7,297,625.

(51) Int. Cl.
*H01L 21/00* (2006.01)
(52) U.S. Cl. .......................... 438/42; 438/604
(58) Field of Classification Search ............ 438/30; 257/E33.023
See application file for complete search history.

(56) References Cited

U.S. PATENT DOCUMENTS 6,809,351 B2 * 10/2004 Kuramoto et al. ........... 257/190
6,812,051 B2 * 11/2004 Usui et al. ................... 438/22

FOREIGN PATENT DOCUMENTS

| CN | 1387231 A | 12/2002 |
|---|---|---|
| EP | 1271627 A2 | 1/2003 |
| JP | 2000-063123 A | 2/2000 |
| JP | 2001-057369 A | 2/2001 |
| JP | 2002-261140 A | 9/2002 |
| JP | 2002-324851 A | 11/2002 |

* cited by examiner

*Primary Examiner*—Thao P. Le
(74) *Attorney, Agent, or Firm*—James W. Judge

(57) ABSTRACT

Favorable-quality III-V crystals are easily obtained at low cost without causing cracks, even when using a variety of substrates. The III-V crystals are obtained by manufacturing method characterized in including: a step of depositing a metal film (2) on a substrate (1); a step of heat-treating the metal film (2) in an atmosphere in which a patterning compound is present; and a step of growing a group III-V crystal (4) on the metal film after the heat treatment. Alternatively, the III-V crystal manufacturing method is characterized in including: a step of growing a group III-V compound buffer film on the metal film after the heat treatment; and a step of growing a group III-V crystal on the group III-V compound buffer film.

6 Claims, 2 Drawing Sheets

GROUP III-V CRYSTAL

BACKGROUND OF THE INVENTION

1. Technical Field

The present invention relates to crystals of group III-V compounds and to methods of their manufacture, and more particularly relates to methods of manufacturing good-quality group III-V crystals without producing cracks, even with the use of a variety of substrates.

2. Description of the Related Art

Growing a crystal of a group III-V compound, such as GaN crystal, on a substrate of a different material from the crystal material, such as a sapphire substrate or a silicon (Si) substrate, causes stress between the crystal and the substrate due to differences in properties such as their crystal lattice constants and thermal expansion coefficients, leading to warps and cracks; thus, the process does not yield group III-V crystals of good quality.

In view of this problem, a method has been carried out for alleviating the stress between the crystals and the substrate by depositing a film of a silicon oxide (such as $SiO_2$) on a sapphire substrate; patterning the silicon oxide film is by a technique such as photolithography, and thereafter growing a group III-V crystal onto the patterned substrate. Such a method, however, is problematic in that it requires the patterning of the silicon oxide film, which means the manufacturing cost is high.

Another technique that has been proposed is one in which a GaN layer is grown on a substrate such as sapphire by a metal organic chemical vapor deposition (MOCVD) technique, followed by the depositing of a metal film thereon and performance of a heat treatment to form voids in the GaN layer; thereafter, a GaN crystal is grown. (See Japanese Unexamined Pat. App. Pub. No. 2002-343728, for example.) Nevertheless, a problem arises with such a method because growing a GaN layer by MOCVD leads to extremely high manufacturing costs.

Still another technique that has been proposed is one in which a metal film is deposited on a sapphire or like substrate and thereafter a GaN crystal is grown. (See Japanese Unexamined Pat. App. Pub. Nos. 2002-284600, for example.) Such a method, however, is problematic in that the qualities of the resulting GaN crystal are compromised because the GaN crystal is grown on a metal film that has a different lattice constant from that of the GaN crystal.

BRIEF SUMMARY OF THE INVENTION

An object of the present invention, brought about to resolve the foregoing problems, is to make available good-quality group III-V crystal that is obtained by a simple, low-cost manufacturing method.

A group III-V compound crystal structure according to the present invention comprises a substrate; a metal film patterned with holes or grooves having an average width of 2 nm to 5000 nm, at an aperture fraction of 5% to 80% with respect to the substrate total surface area; and III-V compound grown on the metal film. The III-V crystal in the structure may be a GaAlInN composition. The substrate may be composed of silicon, sapphire, SiC, $ZrB_2$, or a Group III-V compound, and the metal film may be deposited on the substrate and contain at least titanium or vanadium. A III-V compound crystal structure of the present invention can exhibit a full width at half-maximum (FWHM), by X-ray diffraction (XRD), of 150 arcsec or less.

DETAILED DESCRIPTION OF THE INVENTION

Embodiment 1

Figure 1A:
FIG. 1 illustrates one method of manufacturing a group III-V crystal according to the present invention.
Figure 1B:
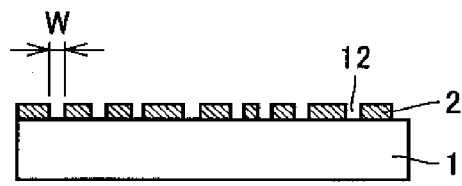
Figure 1C:
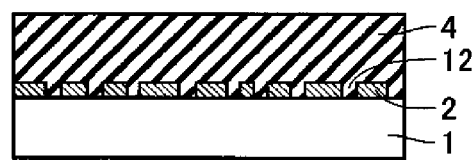

Referring to FIG. 1, one method of manufacturing a group III-V crystal according to the present invention is characterized in comprising a step of depositing a metal film 2 on a substrate 1 as illustrated in FIG. 1A; a step, as represented in FIG. 1B, of heat-treating the metal film 2 under an atmosphere in which a patterning compound is present; and a step, as represented in FIG. 1C, of growing a group III-V crystal 4 on the metal film after the heat treatment.

Figure 3A:
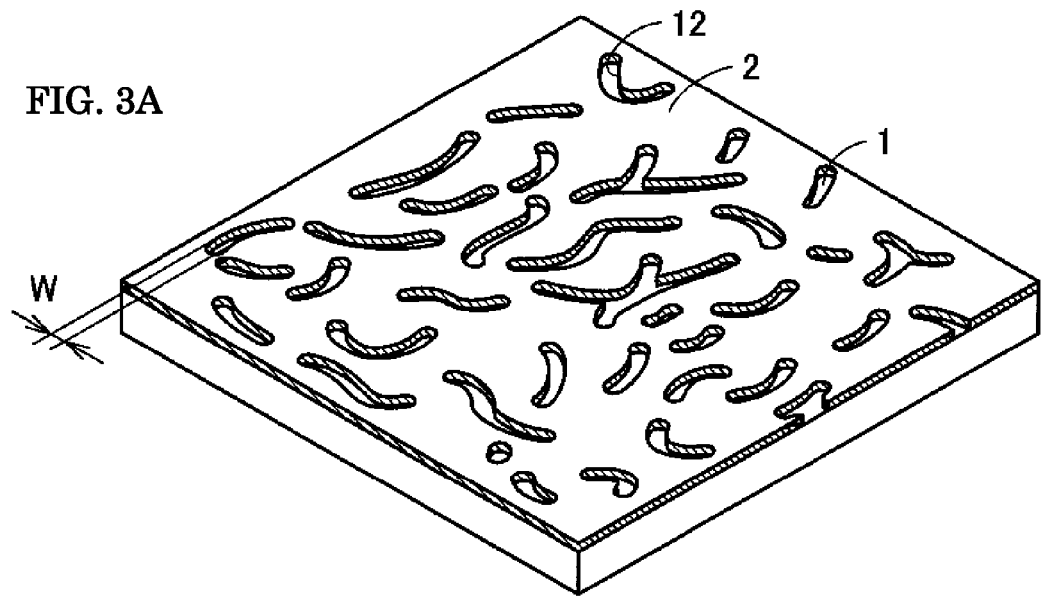
FIG. 3A is a schematic diagram illustrating one representative configuration of holes or grooves formed in a metal film.

Specifically, referring to FIGS. 1 and 3, a method of manufacturing a group III-V crystal according to the present invention is carried out through the following steps. First, as illustrated in FIG. 1A, a metal film 2 is deposited on a substrate 1 using a technique such as vapor deposition or sputtering. Next, the metal film 2 is heat-treated under an atmosphere in which a patterning compound is present, whereby the metal film 2 becomes patterned in indefinite shapes as illustrated in FIG. 1B, forming holes or grooves 12 in a worm-eaten pattern, as illustrated in FIGS. 3A as well as 3B, exposing the substrate 1 at the bottoms of the holes or grooves 12. Subsequently, as illustrated in FIG. 1C, a group III-V crystal 4 is grown, using a technique such as a hydride vapor phase epitaxy (HVPE), onto the metal film 2 in which the holes or grooves 12 in a worm-eaten pattern have been formed following the heat treatment.

Figure 3B:
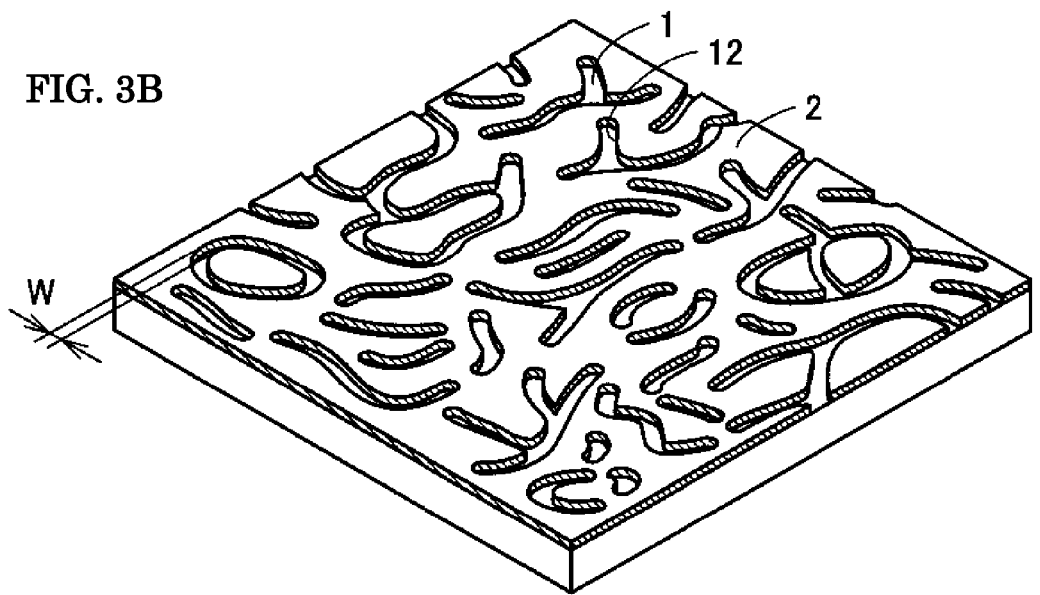
FIG. 3B is a schematic diagram illustrating another representative configuration of holes or grooves formed in a metal film.

Herein, each of FIGS. 3A and 3B schematically illustrates a representative configuration of holes or grooves in a worm-eaten pattern that are formed in the metal film 2 by heat-treating the metal film 2 under an atmosphere in which a patterning compound is present. When the number of holes or grooves is small, a configuration such as that of FIG. 3A tends to form, and as the number of holes or grooves increases, a configuration such as that of FIG. 3B tends to form.

By means of such a manufacturing method, a good-quality group III-V crystal 4 is grown because, as will be seen from FIG. 1, the group III-V crystal 4 can pick up information from the substrate 1 such as its crystal lattice constant. Moreover, the formation in the metal film of the pattern of holes or grooves 12 in worm-eaten contours alleviates the stress between the group III-V crystal 4 and the metal film 2, preventing the group III-V crystal 4 from forming cracks. Furthermore, the manufacturing cost is reduced because the group III-V crystal can be produced by a vapor phase epitaxy (VPE) technique such as the HVPE technique mentioned above, rather than by the high-cost MOCVD technique.

Referring to FIGS. 1 and 3, in the group III-V crystal manufacturing method according to the present invention, it is preferable that the holes or grooves formed in the metal film by heat-treating the metal film under an atmosphere in which a patterning compound is present have an average width W of 2 nm to 5000 nm and that the aperture fraction, which is the surface area that holes or grooves occupy, be 5% to 80% of the total area of the substrate. If the average width W of the holes or grooves is less than 2 nm, the holes or grooves as formed do not reach the substrate, making it difficult to read information from (that is, take on the characteristics of) the substrate. If on the other hand the average width W of the holes or grooves exceeds 5000 nm, it becomes difficult to alleviate stress between the group III-V crystal and the substrate. Given these perspectives, it is further preferable that the average width W of the holes or grooves be from 5 nm to 1000 nm. Further, if the aperture fraction is less than 5% of the total area of the substrate, the smallness of the surface area in which the group III-V crystal is in contact with the substrate would be prohibitive of the growing III-V crystal reading information from the substrate. If on the other hand the aperture fraction exceeds 80%, the excessively large extent to which the metal film is absent would be prohibitive of alleviating stress between the group III-V crystal and the substrate. Given these perspectives, it is further preferable that the aperture fraction be 10% to 50% of the total area of the substrate. Herein, aperture fraction is defined as the percentage of surface area that the holes or grooves occupy with respect to the total area of the substrate, according to the following equation (1):

$$\text{Aperture fraction (\%)} = \frac{\text{(holes or grooves occupying area)}}{\text{(substrate total surface area)}} \times 100 \quad (1)$$

As for the substrate herein, a wide variety of substrates may be used, whether the same kind as or a different kind from the group III-V crystal to be grown, as long as its use does not conflict with the object of the present invention. For example, silicon, sapphire, SiC, $ZrB_2$, or group III-V compounds are preferable because the lattice constants of crystals of these compounds are similar to the lattice constant of the group III-V crystals, and thus, good-quality crystals are readily produced. It should be noted that the group III-V compound used for the substrate need not be the same compound as the group III-V crystal that is to be grown thereon.

Although there are no restrictions on the metal film, a metal film containing titanium (Ti) or vanadium (V), including such metals and alloys as Ti, Ti—Al, V, and V—Al, is preferable from the viewpoint of readiness for patterning.

Although not particularly limited, the thickness of the metal film is preferably 10 nm to 1000 nm. A film thickness of less than 10 nm is prohibitive of causing the metal film to stay in the patterning operation, while the thickness exceeding 1000 nm is prohibitive of exposing the substrate in the patterning operation. In light of these factors, it is preferable that the thickness of the metal film be 30 nm to 500 nm.

A compound that patterns the metal film means a compound, preferable examples of which include ammonia ($NH_3$) and nitrogen ($N_2$), that when a metal film is heat-treated under an atmosphere in which the compound is present patterns into indefinite shapes holes or grooves in worm-eaten contours in the metal film.

Preferable heat-treating conditions for heat-treating of metal film in an atmosphere in which a patterning compound is present are temperatures of 800° C. to 1200° C. for a duration of 0.5 minutes to 20 minutes. If the heat-treatment temperature is less than 800° C. or the heat-treatment time is less than 0.5 minutes, insufficient patterning of the metal film results; if the heat-treatment temperature exceeds 1200° C. or the heat-treatment time exceeds 20 minutes, the metal film is patterned excessively. In light of these factors, it is preferable that the heat-treatment temperature be 900° C. to 1100° C. and the heat-treatment time 0.5 minutes to 10 minutes.

The simple and low-cost manufacturing method described above yields good-quality group III-V crystals. Furthermore, in cases in which the III-V crystals in the foregoing are $Ga_xAl_yIn_{1-x-y}$ ($0 \leq x \leq 1$ and $0 \leq y \leq 1$), because at present there is no other particularly serviceable manufacturing method for such crystals, the method proves to be an invaluable manufacturing technique.

Embodiment 2

Figure 2A:
FIG. 2 illustrates another method of manufacturing a group III-V crystal according to the present invention.
Figure 2B:
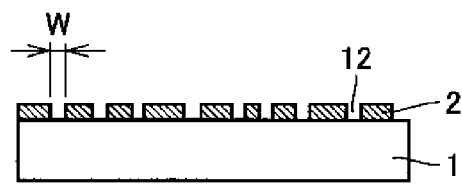
Figure 2C:
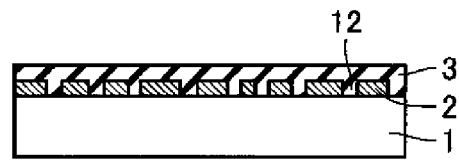
Figure 2D:
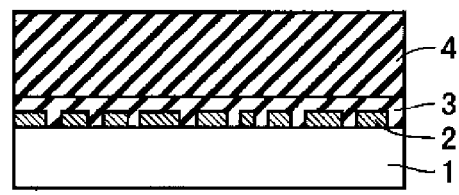

Referring to FIG. 2, another method of manufacturing a group III-V crystal according to the present invention is characterized in comprising: a step of depositing a metal film 2 on a substrate 1 as illustrated in FIG. 2A; a step, as represented in FIG. 2B, of heat-treating the metal film in an atmosphere in which a patterning compound is present; a step, as represented in FIG. 2C, of growing a group III-V compound buffer film 3 on the metal film 2 after the heat treatment; and a step, as represented in FIG. 2D, of growing a group III-V crystal 4 on the group III-V compound buffer film 3.

Specifically, referring to FIGS. 2 and 3, another method of manufacturing a group III-V crystal according to the present invention is carried out through the following steps. First, as illustrated in FIG. 2A, a metal film 2 is deposited on a substrate 1 using such a technique as vapor deposition or sputtering. Next, the metal film 2 is heat-treated in an atmosphere in which a patterning compound is present, whereby the metal film 2 is patterned in indefinite shapes as illustrated in FIG. 2B, forming holes or grooves 12 in worm-eaten contours, as illustrated in FIG. 3A as well as 3B, so that the substrate 1 is exposed in the bottoms of the holes or grooves 12.

Next, using, for example, an HVPE technique a group III-V compound buffer film 3 as illustrated in FIG. 2C is grown onto the post-heat-treated metal film 2 in which the holes or grooves 12 in worm-eaten contours are formed. Herein, the term "a group III-V compound buffer film" 3 refers to an amorphous film of the group III-V compound that is grown at a lower temperature than that for growing the crystal. Subsequently, as illustrated in FIG. 2D, a group III-V crystal 4 is grown on the group III-V compound buffer film 3, using, for example, an HVPE technique.

In Embodiment 2, described above, the formation onto the metal film 2 in which holes or grooves in a worm-eaten pattern have been formed makes it possible to alleviate the stress between the substrate 1 and the group III-V crystal 4 that is later formed on the group III-V compound buffer film 3. Moreover, because the group III-V crystal 4 in growing picks up information not from the substrate 1 but from the amorphous III-V film, even better-quality III-V crystal—crystal that has not taken in unnecessary crystalline information—is produced.

EXAMPLES

Embodiments 1 and 2 described above are further detailed based on specific examples.

Example 1

Reference is made to FIG. 1. Based on Embodiment 1, by a vapor deposition technique a 30 nm-thick metallic Ti film was deposited as a metal film 2 on a substrate 1, as illustrated in FIG. 1A, using a sapphire base as the substrate 1. Next, as represented in FIG. 1B the metal film 2 was heat-treated within a $NH_3$ atmosphere at 1000° C. for 0.5 minutes. The surface of the metal film 2 after its temperature was lowered was observed with a scanning electron microscope (SEM). Holes or grooves in a worm-eaten pattern as shown in FIG. 3A were found; the average width W of the holes or grooves was 8 nm and the aperture fraction was 12%. In addition, a group III-V crystal 4 as illustrated in FIG. 1C was grown at 1000° C. for a 5-hour duration by an HVPE technique using Ga and $NH_3$ as source materials, resulting in a crystal free of cracks. The resulting crystal was found to be a good-quality GaN crystal by an XRD measurement, with its full width at half-maximum (FWHM) in the XRD being 120 arcsec. The results are set forth in Table I.

Examples 2 to 12

With the test conditions set out in Table I, group III-V crystals were grown by the same procedure as in Example 1. The results are summarized in Table I.

Example 13

Reference is made to FIG. 2. Based on Embodiment 2, by a vapor deposition technique a 200 nm-thick metallic Ti film was deposited as a metal film 2 on a substrate 1, as illustrated in FIG. 2A, using a sapphire base as the substrate 1. Next, as represented in FIG. 2B the metal film 2 was heat-treated in a $NH_3$ atmosphere at 1000° C. for 3 minutes. the surface of the metal film 2 after its temperature was lowered was observed with an SEM. Holes or grooves in a worm-eaten pattern as shown in FIG. 3A were found; the average width W of the holes or grooves was 31 nm and the aperture fraction was 22%. Next, a group III-V compound buffer film 3 as illustrated in FIG. 2C was grown at 500° C. for a 0.5-hour duration. Then, a group III-V crystal 4 as illustrated in FIG. 2D was grown at 1000° C. for a 5-hour duration by an HVPE technique using Ga and $NH_3$ as source materials, resulting in a crystal free of cracks. The resulting crystal was found to be a good-quality GaN crystal by an XRD measurement, with its FWHM in the XRD being 80 arcsec. The results are set forth in Table I.

TABLE I

|  | Substrate type | Ex. 1 Sapphire | Ex. 2 Sapphire | Ex. 3 GaAs | Ex. 4 Sapphire | Ex. 5 Si | Ex. 6 AlN | Ex. 7 $ZrB_2$ |
|---|---|---|---|---|---|---|---|---|
| Metal film | Class (Composition: mole %) | Ti | Ti | Ti | Ti | Ti | Ti | Ti |
|  | Film thickness (nm) | 30 | 200 | 200 | 200 | 200 | 500 | 200 |
| Heat treatment | Atmosphere (Composition: mole %) | $NH_3$ | $NH_3$ | $NH_3$ | $NH_3$ | $NH_3$ | $N_2$ | $NH_3$ (40) $H_2$ (60) |
|  | Temp. (° C.) | 1000 | 800 | 1000 | 1000 | 1100 | 1200 | 1000 |
|  | Duration (min.) | 0.5 | 10 | 6 | 3 | 3 | 10 | 3 |
| Hole/groove width (nm) |  | 8 | 10 | 110 | 31 | 280 | 900 | 32 |
| Aperture fraction (%) |  | 12 | 25 | 34 | 22 | 45 | 75 | 22 |
| Crystal growth | Source material 1 (Composition: mole %) | Ga | Ga | Ga | Ga | Ga | Ga | Ga |
|  | Source material 2 (Composition: mole %) | $NH_3$ | $NH_3$ | $NH_3$ | $NH_3$ | $NH_3$ | $NH_3$ | $NH_3$ |
|  | Temp. (° C.) | 1000 | 1100 | 1000 | 1000 | 1100 | 1000 | 1000 |
|  | Duration (hrs.) | 5 | 5 | 5 | 5 | 5 | 5 | 5 |
| Cracking incidents |  | None | None | None | None | None | None | None |
| Crystal composition (XRD-identified) |  | GaN | GaN | GaN | GaN | GaN | GaN | GaN |
| XRD FWHM (arcsec) |  | 120 | 120 | 103 | 110 | 105 | 108 | 118 |

|  | Substrate type | Ex. 8 GaN | Ex. 9 SiC | Ex. 10 Sapphire | Ex. 11 Sapphire | Ex. 12 Si |
|---|---|---|---|---|---|---|
| Metal film | Class (Composition: mole %) | Ti (90) Al (10) | V | V | Ti | Ti |
|  | Film thickness (nm) | 300 | 200 | 200 | 200 | 200 |
| Heat treatment | Atmosphere (Composition: mole %) | $NH_3$ | $NH_3$ | $NH_3$ | $NH_3$ | $NH_3$ |
|  | Temp. (° C.) | 1000 | 1000 | 1000 | 1000 | 1100 |
|  | Duration (min.) | 3 | 3 | 2 | 3 | 3 |
| Hole/groove width (nm) |  | 26 | 29 | 18 | 31 | 280 |
| Aperture fraction (%) |  | 18 | 11 | 8 | 22 | 38 |
| Crystal growth | Source material 1 (Composition: mole %) | Ga | Ga | Ga (80) Al (10) In (10) | Al | Ga (70) Al (30) |
|  | Source material 2 (Composition: mole %) | $NH_3$ | $NH_3$ | $NH_3$ | $NH_3$ | $NH_3$ |
|  | Temp. (° C.) | 1000 | 1100 | 1000 | 1000 | 1100 |
|  | Duration (hrs.) | 5 | 5 | 5 | 5 | 5 |
| Cracking incidents |  | None | None | None | None | None |
| Crystal composition (XRD-identified) |  | GaN | GaN | $Ga_{0.8}Al_{0.1}In_{0.1}N$ | AlN | $Ga_{0.7}Al_{0.3}N$ |
| XRD FWHM (arcsec) |  | 135 | 138 | 150 | 115 | 97 |

Examples 14 to 20

With the test conditions set out in Table II, group III-V crystals were grown in the same procedure as in Example 13. The results are summarized in Table II.

TABLE II

| | Substrate type | Ex. 13 Sapphire | Ex. 14 Si | Ex. 15 GaAs | Ex. 16 AlN | Ex. 17 GaN | Ex. 18 SiC | Ex. 19 Sapphire | Ex. 20 Si |
|---|---|---|---|---|---|---|---|---|---|
| Metal film | Class (Comp.: mole %) | Ti | Ti | Ti | Ti | Ti (90) Al (10) | V | Ti | Ti |
| | Film thickness (nm) | 200 | 200 | 200 | 500 | 300 | 200 | 200 | 200 |
| Heat treatment | Atmosphere (Comp.: mole %) | $NH_3$ | $NH_3$ | $NH_3$ | $N_2$ | $NH_3$ | $NH_3$ | $NH_3$ | $NH_3$ |
| | Temp. (° C.) | 1000 | 1100 | 1000 | 1200 | 1000 | 1000 | 1000 | 1100 |
| | Duration (min.) | 3 | 3 | 6 | 10 | 3 | 3 | 3 | 3 |
| Hole/groove width (nm) | | 31 | 280 | 110 | 900 | 26 | 29 | 31 | 280 |
| Aperture fraction (%) | | 22 | 45 | 34 | 75 | 18 | 11 | 22 | 38 |
| Buffer film growth | Source material 1 (Comp.: mole %) | Ga | Ga | Al | Ga | Ga | Ga | Al | Ga (70) Al (30) |
| | Source material 2 (Comp.: mole %) | $NH_3$ | $NH_3$ | $NH_3$ | $NH_3$ | $NH_3$ | $NH_3$ | $NH_3$ | $NH_3$ |
| | Temp. (° C.) | 500 | 500 | 500 | 500 | 500 | 500 | 500 | 500 |
| | Duration (hrs.) | 0.5 | 0.5 | 0.5 | 0.5 | 0.5 | 0.5 | 0.5 | 0.5 |
| Crystal growth | Source material 1 (Comp.: mole %) | Ga | Ga | Ga | Ga | Ga | Ga | Al | Ga (70) Al (30) |
| | Source material 2 (Comp.: mole %) | $NH_3$ | $NH_3$ | $NH_3$ | $NH_3$ | $NH_3$ | $NH_3$ | $NH_3$ | $NH_3$ |
| | Temp. (° C.) | 1000 | 1100 | 1000 | 1000 | 1000 | 1000 | 1000 | 1100 |
| | Duration (hrs.) | 5 | 5 | 5 | 5 | 5 | 5 | 5 | 5 |
| Cracking incidents | | None | None | None | None | None | None | None | None |
| Crystal composition (XRD-identified) | | GaN | GaN | GaN | GaN | GaN | GaN | AlN | $Ga_{0.7}Al_{0.3}N$ |
| XRD FWHM (arcsec) | | 80 | 65 | 72 | 85 | 88 | 92 | 90 | 78 |

As is evident from Tables I and II, good-quality group III-V crystals that are free from cracks were obtained in all of the examples. Furthermore, it will be understood from comparisons, for example, between Examples 4 and 13, and between Examples 11 and 19, that the FWHMs of the crystals in the XRD analysis were reduced from 110 arcsec to 80 arcsec and from 115 arcsec to 90 arcsec, respectively, and that growing the buffer film prior to growing a group III-V crystal improved the quality of the crystals further.

It should be understood that the presently disclosed embodiments and examples are in all respects illustrative and not limiting. The scope of the present invention is set forth not by the foregoing description but by the scope of the patent claims, and is intended to include meanings equivalent to the scope of the patent claims and all modifications within the scope.

INDUSTRIAL APPLICABILITY

As described in the foregoing, in accordance with the present invention, the provision of a step of depositing a metal film on a substrate, a step of heat-treating the metal film in an atmosphere in which a patterning compound is present, and a step of growing a group III-V crystal on the metal film after the heat treatment, yields good-quality group III-V crystals without causing cracks, using a simple and low-cost manufacturing method.

What is claimed is:

1. A Group III-V compound crystal structure comprising:
   a substrate;
   a metal film patterned with holes or grooves having an average width of 2 nm to 5000 nm, at an aperture fraction of 5% to 80% with respect to the substrate total surface area; and
   a Group III-V compound crystal grown on said metal film.

2. A group III-V compound crystal structure as set forth in claim 1, wherein the full width at half maximum by x-ray deffraction of the III-V crystal is 150 arcsec or less.

3. A group III-V compound crystal structure as set forth in claim 1, wherein the Group III-V compound crystal is a GaAlInN composition.

4. A group III-V compound crystal structure as set forth in claim 1, further comprising a buffer layer formed in between the metal film and the Group III-V compound crystal.

5. A group III-V compound crystal structure comprising:
   a substrate composed of one substance selected from the group consisting of silicon, sapphire, SiC, $ZrB_2$, or a Group III-V compound;
   a metal film containing at least titanium or vanadium, deposited on said substrate, said metal film being patterned with holes or grooves having an average width of 2 nm to 5000 nm, at an aperture fraction, being the percentage of the surface area that the holes or grooves occupy with respect to the substrate total surface area, of 5% to 80%; and
   a group III-V compound crystal grown onto the metal film; wherein
   the full width at half maximum by x-ray diffraction of the grown III-V compound is 150 arcsec or less.

6. A group III-V compound crystal as set forth in claim 5, further comprising a Group III-V compound buffer layer provided in between said metal film and said Group III-V compound crystal.

* * * * *

UNITED STATES PATENT AND TRADEMARK OFFICE
CERTIFICATE OF CORRECTION

PATENT NO.         : 7,485,484 B2
APPLICATION NO.    : 11/871162
DATED              : February 3, 2009
INVENTOR(S)        : Seiji Nakahata, Koji Uematsu and Ryu Hirota It is certified that error appears in the above-identified patent and that said Letters Patent is hereby corrected as shown below:

On the Title page, at item (62) under the heading Related U.S. Application Data, "Division of application No. 10/521,060, filed on Dec. 30, 2004, now Pat. No. 7,297,625" should read --Division of application No. 10/521,060, filed on Dec. 30, 2004, now Pat. No. 7,297,625, and which was the National Stage of International Application No. PCT/JP04/04811, filed on April 1, 2004, now expired--.

Signed and Sealed this
Twenty-second Day of October, 2013

Teresa Stanek Rea
*Deputy Director of the United States Patent and Trademark Office*